(12) United States Patent
Bergman et al.

(10) Patent No.: US 7,378,355 B2
(45) Date of Patent: May 27, 2008

(54) SYSTEM AND METHODS FOR POLISHING A WAFER

(75) Inventors: Eric J. Bergman, Kalispell, MT (US); Thomas Maximilian Gebhart, Murnau (DE)

(73) Assignee: Semitool, Inc., Kalispell, MT (US)

( * ) Notice: Subject to any disclaimer, the term of this patent is extended or adjusted under 35 U.S.C. 154(b) by 226 days.

(21) Appl. No.: 11/127,052

(22) Filed: May 11, 2005

(65) Prior Publication Data
US 2005/0236363 A1    Oct. 27, 2005

Related U.S. Application Data

(63) Continuation-in-part of application No. 11/005,553, filed on Dec. 6, 2004, and a continuation-in-part of application No. 10/975,194, filed on Oct. 27, 2004, now abandoned, which is a continuation-in-part of application No. 10/631,376, filed on Jul. 30, 2003, which is a continuation-in-part of application No. 09/621,028, filed on Jul. 21, 2000, now Pat. No. 6,869,487, and a continuation-in-part of application No. PCT/US99/08516, filed on Apr. 16, 1999, and a continuation-in-part of application No. 09/061,318, filed on Apr. 16, 1998, now abandoned, and a continuation-in-part of application No. 08/853,649, filed on May 9, 1997, now Pat. No. 6,240,933.

(60) Provisional application No. 60/145,350, filed on Jul. 23, 1999, provisional application No. 60/125,304, filed on Mar. 19, 1999, provisional application No. 60/099,067, filed on Sep. 3, 1998.

(51) Int. Cl.
*H01L 21/461* (2006.01)
*H01L 21/302* (2006.01)

(52) U.S. Cl. ............... 438/753; 438/745; 257/E21.251

(58) Field of Classification Search ............... 438/745, 438/753; 216/88
See application file for complete search history.

(56) References Cited

U.S. PATENT DOCUMENTS 4,186,032 A    1/1980    Ham (Continued)

FOREIGN PATENT DOCUMENTS

DE    19801360 A1    7/1999

(Continued)

OTHER PUBLICATIONS

Alder, M., et al., "The Kinetics and Mechanism of Hydroxide Ion Catalyzed Ozone Decomposition in Aqueous Solution." J. Am. Chem. Soc., 72:1884-1886 (1950).

(Continued)

*Primary Examiner*—Alexander G. Ghyka
(74) *Attorney, Agent, or Firm*—Perkins Coie LLP; Kenneth H. Ohriner

(57) ABSTRACT

In methods for smoothing or polishing a surface of a wafer, such as a silicon wafer, a liquid layer is formed on a surface of the wafer. The liquid layer may be an invisible microscopic layer, or a visible macroscopic layer. A flow of an oxidizing gas is directed over, against or onto the liquid layer of the surface of the wafer, in the presence of an etchant. The flow of gas thins the liquid layer at high points or areas on the surface of the wafer more than at low points or areas on the wafer surface. Consequently, the high points are oxidized and etched away more than the low points. As a result, the wafer surface is smoothed and polished.

16 Claims, 4 Drawing Sheets

U.S. PATENT DOCUMENTS

| | | | |
|---|---|---|---|
| 4,695,327 A | 9/1987 | Grebinski | |
| 4,749,440 A | 6/1988 | Blackwood et al. | |
| 4,778,532 A | 10/1988 | McConnell et al. | |
| 4,817,652 A | 4/1989 | Liu | |
| 4,899,767 A | 2/1990 | McConnell et al. | |
| 4,917,123 A | 4/1990 | McConnell et al. | |
| 4,974,530 A | 12/1990 | Lyon | |
| 5,032,218 A | 7/1991 | Dobson | |
| 5,055,138 A | 10/1991 | Slinn | |
| 5,063,609 A | 11/1991 | Lorimer | |
| 5,071,485 A | 12/1991 | Matthews et al. | |
| 5,105,556 A | 4/1992 | Kurokawa et al. | |
| 5,120,370 A | 6/1992 | Mori et al. | |
| 5,147,499 A | 9/1992 | Szwejkowski et al. | |
| 5,181,985 A | 1/1993 | Lampert et al. | |
| 5,232,511 A | 8/1993 | Bergman | |
| 5,234,540 A | 8/1993 | Grant et al. | |
| 5,235,995 A | 8/1993 | Bergman et al. | |
| 5,244,000 A | 9/1993 | Stanford et al. | |
| 5,246,526 A | 9/1993 | Yamaguchi et al. | |
| 5,248,380 A | 9/1993 | Tanaka | |
| 5,308,745 A | 5/1994 | Schwartzkopf | |
| 5,326,406 A | 7/1994 | Kaneko et al. | |
| 5,372,651 A | 12/1994 | Kodama | |
| 5,378,317 A | 1/1995 | Kashiwase et al. | |
| 5,415,191 A | 5/1995 | Mashimo et al. | |
| 5,423,944 A | 6/1995 | Wong | |
| 5,464,480 A | 11/1995 | Matthews | |
| 5,503,708 A | 4/1996 | Koizumi et al. | |
| 5,520,744 A | 5/1996 | Fujikawa et al. | |
| 5,571,367 A | 11/1996 | Nakajima et al. | |
| 5,632,847 A | 5/1997 | Ohno et al. | |
| 5,647,386 A | 7/1997 | Kaiser | |
| 5,658,615 A | 8/1997 | Hasebe et al. | |
| 5,705,089 A | 1/1998 | Sugihara et al. | |
| 5,714,203 A | 2/1998 | Schellenberger et al. | |
| 5,749,975 A | 5/1998 | Li et al. | |
| 5,759,971 A | 6/1998 | Manako | |
| 5,776,296 A | 7/1998 | Matthews | |
| 5,803,982 A | 9/1998 | Kosofsky et al. | |
| 5,832,177 A | 11/1998 | Shinagawa et al. | |
| 5,858,107 A | 1/1999 | Chao et al. | |
| 5,868,866 A | 2/1999 | Maekawa et al. | |
| 5,896,875 A | 4/1999 | Yoneda | |
| 5,911,836 A | 6/1999 | Hada et al. | |
| 5,911,837 A | 6/1999 | Matthews | |
| 5,922,624 A | 7/1999 | Verhaverbeke et al. | |
| 5,927,306 A | 7/1999 | Izumi et al. | |
| 5,944,907 A | 8/1999 | Ohmi | |
| 5,950,643 A | 9/1999 | Miyazaki et al. | |
| 5,964,952 A | 10/1999 | Kunze-Concewitz | |
| 5,964,954 A | 10/1999 | Matsukawa et al. | |
| 5,971,368 A | 10/1999 | Nelson et al. | |
| 6,146,469 A | 11/2000 | Toshima | |
| 6,162,734 A | 12/2000 | Bergman et al. | |
| 6,249,933 B1 | 6/2001 | Berfield | |
| 6,267,125 B1 | 7/2001 | Bergman et al. | |
| 6,273,108 B1 | 8/2001 | Bergman et al. | |
| 6,299,696 B2 | 10/2001 | Kamikawa et al. | |
| 6,406,551 B1 | 6/2002 | Nelson et al. | |
| 6,413,878 B1 | 7/2002 | Woolsey et al. | |
| 6,497,768 B2 | 12/2002 | Bergman | |
| 6,551,409 B1 | 4/2003 | DeGendt | |
| 6,582,525 B2 | 6/2003 | Bergman | |
| 6,758,938 B1 | 7/2004 | Torek et al. | |
| 6,806,205 B2 | 10/2004 | Jang et al. | |
| 6,817,370 B2 | 11/2004 | Bergman et al. | |
| 6,843,857 B2 | 1/2005 | Bergman | |
| 6,869,487 B1 | 3/2005 | Bergman | |
| 6,982,006 B1 | 1/2006 | Boyers et al. | |
| 2002/0011257 A1 | 1/2002 | DeGendt | |
| 2002/0066464 A1 | 6/2002 | Bergman | |
| 2002/0088478 A1 | 7/2002 | DeGendt et al. | |

FOREIGN PATENT DOCUMENTS

| | | |
|---|---|---|
| EP | 0 344 764 | 12/1989 |
| EP | 0 548 596 | * 11/1992 |
| EP | 0 548 596 | 6/1993 |
| EP | 0 587 889 | 3/1994 |
| EP | 0 702 399 | 3/1996 |
| EP | 0 782 177 | * 12/1996 |
| EP | 0782 177 | * 1/1997 |
| EP | 0 782 177 | 7/1997 |
| GB | 2 287 827 | 9/1995 |
| JP | 52-012063 | 4/1977 |
| JP | 54-034751 | 3/1979 |
| JP | 61-004232 | 1/1986 |
| JP | 62-117330 | 5/1987 |
| JP | 63-110732 | 5/1987 |
| JP | 64-008630 | 1/1989 |
| JP | 01-042129 | 2/1989 |
| JP | 01-189921 | 7/1989 |
| JP | 01-262627 | 10/1989 |
| JP | 03-041729 | 2/1991 |
| JP | 03-072626 | 3/1991 |
| JP | 03-208900 | 9/1991 |
| JP | 04-079221 | 3/1992 |
| JP | 04-125927 | 4/1992 |
| JP | 04-164324 | 6/1992 |
| JP | 04-298038 | 10/1992 |
| JP | 04-302144 | 10/1992 |
| JP | 04-302145 | 10/1992 |
| JP | 04-370931 | 12/1992 |
| JP | 05-013398 | 1/1993 |
| JP | 05-109686 | 4/1993 |
| JP | 05-259139 | 10/1993 |
| JP | 05-283389 | 10/1993 |
| JP | 06-204130 | 7/1994 |
| JP | 07-159980 | 6/1995 |
| JP | 08-008222 | 1/1996 |
| WO | WO99/52654 | 10/1999 |

OTHER PUBLICATIONS

Amick, J.A., "Cleanliness and the Cleaning of Silicon Wafers." Solid State Technology, pp. 47-52 (Nov. 1976).

Anantharaman, et al., "ORGANICS: Detection and Characterization of Organics in Semiconductor DI Water Processes." Ultrapure Water, pp. 30-36 (Apr. 1994).

Baumgärtner, H., et al., "Ozone Cleaning of the Si-SiO2 System." Appl. Phys. A, 43:223-226 (1987).

Bedge, S., et al., "Kinetics of UV/O2 Cleaning and Surface Passivation: Experiments and Modeling." Mat. Res. Soc. Symp. Proc., 259:207-212 (1992).

Bergman, E. et al., "HF-Ozone Cleaning Chemistry," Solid State Technology 46(7):115-124(2001).

Bolon, D.A., et al., "Ultraviolet Depolymerization of Photoresist Polymers," Polymer Engineering and Science, 12(2):108-111 (1972).

Christenson, K., et al., "Deionized Water Helps Remove Wafer Stripping 'Resist'-ance." www.precisioncleaningweb.com—Precision Cleaning Web—Archives, pp. 10-20 (Apr. 1998).

Egitto, F.D., et al., "Removal of Poly (Dimethylsiloxane) Contamination From Silicon Surfaces With UV/Ozone Treatment." Mat. Res. Soc. Symp. Proc., 385:245-250 (1995).

Gabriel, C., et al., "Reduced Device Damage Using An Ozone Based Photoresist Removal Process." SPIE Advances in Resist Technology and Processing VI, 1086:598-604 (1989).

Ganesan, G., et al., "Characterizing Organic Contamination in IC Package Assembly." The Int'l. Soc. for Hybrid Microelectronics, 17(2), Second Quarter, 152-160 (1994).

Golland, D.E., et al., "The Clean Module: Advanced Technology for Processing Silicon Wafers." Semiconductor Int'l., pp. 154-157 (Sep. 1987).

Goulding, M.R., "The selective epitaxial growth of silicon," Materials Science and Engineering, vol. B17, pp. 47-67 (1993).

Heyns, M.M., et al., "New Wet Cleaning Strategies for Obtaining Highly Reliable Thin Oxides." MRP Symposium Proceedings on Materials Research Society, Spring Meeting, San Francisco, CA, Apr. 12-13, p. 35 (1993).

Huynh, C., et al., "Plasma versus ozone photoresist ashing: Temperature effects on process-induced mobile ion contamination." J. Vac. Sci. Technol., B9(2):353-356 (Mar./Apr. 1991).

Isagawa, T., et al., "Ultra Clean Surface Preparation Using Ozonized Ultrapure Water." Extended Abstracts of the 1992 Int'l. Conf. on Solid State Devices and Materials, pp. 193-195 (1992).

Kasi, S., et al., "Surface Hydrocarbon Removal from Si by UV/Ozone." ECS Extended Abstracts, No. 458, pp. 691-692 (1990).

Kasi, S., et al., "Vapor phase hydrocarbon removal for Si processing." Appl. Phys. Lett., 57(20):2095-2097 (Nov. 1990).

Kern, W., "The Evolution of Silicon Wafer Cleaning Technology." J. Electrochem. Soc., 137(6):1887-1892 (Jun. 1990).

Krusell, W.C., et al., "The Characterization of Silicon Substrate Cleaning Treatments by use of SIMS and MOS Electrical Testing." ECS Extended Abstracts, No. 229, p. 331-332 (1986).

Krusell, W.C., et al., "Cleaning Technologies for High Volume Production of Silicon Wafers." ECS Proc. of the First Int'l. Symposium on Cleaning Technology in Semiconductor Device Mfg., pp. 23-32 (Oct. 1989).

Nelson, S., "Ozonated water for photoresist removal." Solid State Technology, p. 107-112 (Jul. 1999).

Ohmi, T., et al., "Native Oxide Growth and Organic Impurity Removal on Si Surface with Ozone-Injected Ultrapure Water." J. Electrochem. Soc., 140(3):804-810 (Mar. 1993).

Sehested, K., et al., "Decomposition of Ozone in Aqueous Acetic Acid Solutions (pH 0-4)." J. Phys. Chem., pp. 1005-1009 (1992).

Shimada, H., et al., "Residual-Surfactant-Free Photoresist Development Process." J. Electrochem., Soc., 139(6):1721-1730 (Jun. 1992).

Suemitsu, M., et al., "Low Temperature Silicon Surface Cleaning by HF Etching/Ultraviolet Ozone Cleaning (HF/UVOC) Method (I)-Optimization of the HF Treatment." Japanese Journal of Applied Physics, 28(12):2421-2424 (Dec. 1989).

Tabe, M., "UV ozone cleaning of silicon substrates in silicon molecular beam epitaxy." Appl. Phys. Lett., 45(10):1073-1075 (Nov. 1984).

Tong, J., et al., "Aqueous Ozone Cleaning of Silicon Wafers." ECS Extended Abstracts, Phoenix, AZ, Abstract No. 506, pp. 753 (Oct. 13-17, 1991).

Tong, J., et al., "Aqueous Ozone Cleaning of Silicon Wafers." Proc. of 2.sup.nd Int'l . Symposium on Cleaning Tech. In Semiconductor Mfg., pp. 18-25 (Oct. 1992).

Vig, J., "UV/Ozone Cleaning of Surfaces." U.S. Army Elec. Tech. and Devices Lab., pp. 1-26.

Vig, J., "UV/Ozone Cleaning of Surfaces: A Review." Surface Contamination: Genesis, Detection, and Control, pp. 235-253 (1979).

Vig, J., et al., "UV/Ozone Cleaning of Surfaces." IEEE Transactions on Parts, Hybrids, and Packaging, vol. PHP-12(4):365-370 (Dec. 1976).

Vig, J., "UV/Ozone Cleaning of Surfaces." U.S. Army Electronics Technology and Devices Laboratory, ERADCOM, Ft. Monmouth, NJ, 07703-5302, pp. 1027-1034 (Sep./Oct. 1984).

Zafonte, L., et al., "UV/Ozone Cleaning For Organics Removal on Silicon Wafers." SPIE Optical Microlithography III: Technology for the Next Decade, 470:164-175 (1984).

Zazzera, L.A., et al., "XPS and SIMS Study of Anhydrous HF and UV/Ozone-Modified Silicon (100) Surfaces." J. Electrochem. Soc., 136(2):484-491 (Feb. 1989).

"Ozone Concentration Measurement in a Process Gas." Proposed IOA Pan American Group Guideline, pp. 1-21 (Dec. 1993).

"Ozone for Semiconductor Applications." Sorbios, pp. 1-6 (Oct. 1991).

\* cited by examiner

SYSTEM AND METHODS FOR POLISHING A WAFER

This Application is a Continuation-in-Part of U.S. patent application Ser. No. 10/975,194, filed Oct. 27, 2004 and now abandoned; which is a Continuation-in-Part of application Ser. No. 10/631,376, filed Jul. 30, 2003, now pending; which is a Continuation-in-Part of U.S. patent application Ser. No. 09/621,028, filed Jul. 21, 2000 and now U.S. Pat. No. 6,869,487.

U.S. patent application Ser. No. 09/621,028 claims priority to U.S. Provisional Patent Application No. 60/145,350 filed Jul. 23, 1999; and is a Continuation-in-Part of Ser. No. 08/853,649, filed May 9, 1997, now U.S. Pat. No. 6,240,933; and is also a Continuation-in-Part of International Application PCT/US99/08516, filed Apr. 16, 1999.

International Application PCT/US99/08516 claims priority to U.S. Provisional Patent Application Ser. Nos. 60/125,304 filed Mar. 19, 1999; and 60/099,067 filed Sep. 3, 1998; and is a Continuation-in-Part of U.S. patent application Ser. No. 09/061,318, filed Apr. 16, 1998, now abandoned. The applications listed above are incorporated herein by reference.

This Application is also a Continuation-in-Part of U.S. patent application Ser. No. 11/005,553, filed Dec. 6, 2004 and now pending.

BACKGROUND OF THE INVENTION

Silicon wafer polishing is an important step in manufacturing semiconductor devices, micro-electro mechanical systems (MEMS), micro-optical devices, and similar micro-scale devices manufactured on a substrate. Polishing the wafer provides the mirror-like and very flat surface required for the fabrication of micro-scale devices. Conventionally, wafer polishing is a multi-step process using a slurry containing abrasives, and chemical mixtures, such as acids. The wafer is secured on a turntable and is rotated. Polishing heads, such as pads, brushes, sponges, etc. press on the rotating wafer. A combination of chemical and mechanical effects polish the wafer. This type of polishing, known as chemical-mechanical polishing, or "CMP", has been widely used for over 30 years.

In practice, polishing can be a complex process presenting many challenges and complications. Changes in various polishing parameters, including spin speed, pressure, time, slurry composition, wafer flatness, pad wear, uniformity of loading, etc. can affect the outcome. In addition, these chemical/mechanical processes generally require several remedial follow on steps, to reduce stresses in the wafer created by the polishing step, or to remove slurry particles or other contamination caused by the polishing step. Moreover, wafer polishing can be time consuming in the manufacturing process. While extensive research and development efforts have concentrated on trying to reduce these disadvantages, especially in the semiconductor industry, the basic underlying problems with CMP remain. Accordingly, while CMP and other existing polishing technology has achieved various successes, there is vast need for improved polishing techniques.

SUMMARY OF THE INVENTION

It has now been discovered that wafers may be polished without using abrasives, and even without direct physical contact with the wafer. Accordingly, the problems created from the use of abrasives, slurries, and mechanical polishing elements are avoided. In a complete and radical departure from convention polishing methods, in a new polishing method, high points on a wafer surface are removed via a chemical or oxidation reaction. The wafer is polished to an extremely flat and smooth surface finish, equivalent to the surface finish achieved by traditional chemical-mechanical polishing. As no abrasive or other contaminant particles are used, and as no stress inducing mechanical contact is made with the wafer, the need for remedial follow up cleaning or stress relieving steps is reduced or avoided. Manufacture of micro-scale devices is therefore improved.

In a method for smoothing or polishing a wafer, a flow of an oxidizing gas is directed at or across a liquid film or layer on the wafer surface. An etchant is provided in the liquid film or with the oxidizing gas. The flow of the oxidizing gas (or the combined flow of oxidizing gas and the etchant) polishes the wafer surface. Spinning the wafer may be used to help to maintain the liquid film, and to maintain a fresh film of liquid on the wafer surface, although polishing may be achieved without spinning.

Systems for smoothing or polishing a wafer operate on a single wafer, or on a batch of wafers. The systems deliver an oxidizing gas and an etchant into a process chamber. The oxidizing gas is sprayed, jetted or otherwise flowed onto or across the wafer from nozzles or other outlets in the process chamber. The etchant may be provided as a vapor with the flow of oxidizing gas, or provided in or on the liquid film. The systems may also be suitable for performing other non-polishing processes as well, including cleaning processes.

The invention resides as well in sub-combinations of the methods and systems described.

BRIEF DESCRIPTION OF THE DRAWINGS

The drawings are provided merely to show examples of systems that may be used for carrying out polishing methods. All of the elements shown in the drawings are not necessarily essential. In the drawings, wherein the same reference number indicates the same element, in each of the views.

DETAILED DESCRIPTION

I. Overview

Figure 1:
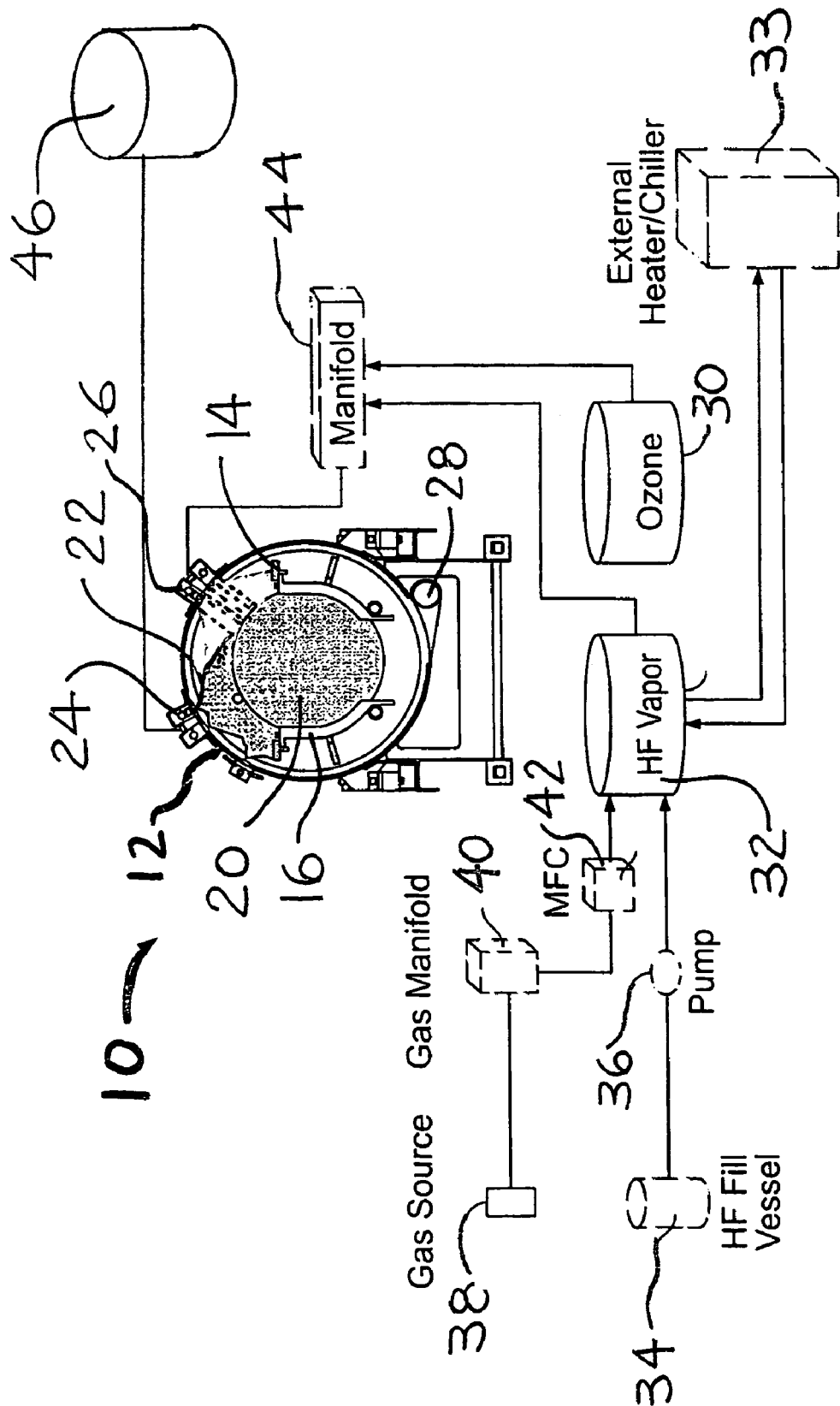
FIG. 1 is a schematic diagram of a batch mode wafer polishing system.

Polishing a silicon wafer is achieved by providing a microscopic or a macroscopic liquid film or layer on the wafer surface. An oxidizing gas is flowed across, onto, or against the liquid layer, in the presence of an etchant. The flow of the oxidizing gas interacts with the liquid layer causing the wafer to be polished. The flow of oxidizing gas appears to thin out the liquid layer at the high spots or areas on the wafer surface, more than at the low spots or areas on the wafer surface. Consequently, the high spots are oxidized more than the low spots. The high spots are therefore chemically removed, resulting in a polished and flat wafer surface. The low points are protected more by the thicker liquid film over them, and so are less exposed to the oxidizing gas and are slower to etch. Spinning the wafer during polishing helps to maintain polishing uniformity, but is not essential. Low spin speeds, e.g., 1-10, 1-20, or 1-50 rpm provide better uniformity in comparison to higher speeds. After the polishing process, the wafer may be rinsed, or rinsed and dried prior to further processing. However, rinsing in most cases may not be needed.

It is well known that ozone and HF will etch silicon, with the ozone oxidizing silicon and the HF dissolving the oxide. However, cleaning a silicon wafer by etching typically involves removing a few angstroms of material from the wafer surface. On the other hand, polishing involves removal of e.g., 1, 2, 3, 4, or 5 and up to 30, 40, or 50 microns (per side) to achieve a smooth and polished finish.

The oxidizing gas and the etchant may be delivered to the wafer surface either simultaneously, or in a sequence such that the affected areas of the wafer surface are oxidized, and then the oxidized areas are dissolved by the etchant.

For polishing silicon wafers, ozone works well as the oxidizing gas, and hydrofluoric acid (HF) works well at the etchant. Other etchants that may be used include ammonium fluoride or other halogenated compounds.

II. Liquid Film

The liquid film or layer may be either continuous or in the form of discrete droplets or wetted and non-wetted regions, since the process involves the creation of both hydrophobic and hydrophilic surfaces. The liquid film or layer may be either microscopic or macroscopic. A microscopic liquid layer may be a condensed phase layer formed from a vapor/gas environment. A microscopic film, although present, may not always be visible. Accordingly, a microscopic liquid film or layer may be difficult to detect. While the presence of a microscopic film can sometimes be detected by instruments, such as laser interferometry, the presence of a microscopic film is generally more easily established indirectly.

For example, one indication of the presence of a microscopic liquid film is when an increase in the temperature in the chamber results in a decrease in the polishing or etch rate. Contrary to this observation, kinetic theory would predict an increase in polishing or etch rate with an increase in temperature. The decrease occurs because at higher temperatures the microscopic film does not form as readily, thereby decreasing the concentration of reactants at the wafer surface. Since all rate equations are a function of reaction species and temperature, the implication is that the concentration of reactants at the point of reaction has been reduced, i.e. that the film while present at the lower temperature had been reduced or eliminated at the higher temperature.

A macroscopic liquid layer is a visible liquid film or layer formed on the wafer surface by spraying or otherwise delivering liquid onto the wafer surface. Both types of liquid film may be produced in various ways. For example, the liquid film may be created by forming a condensation film from a gas/vapor phase, or by forming a condensed phase on the wafer surface from a gas/vapor phase. Condensing steam may similarly be used. The wafer may also be immersed the wafer in liquid with a section of the wafer, or the entire wafer, then removed from contact with the liquid, leaving a liquid film on the wafer. A liquid film may also be created by spraying liquid onto the wafer (in a stream of mist of droplets), or by bulk transfer of liquid onto the wafer from a liquid outlet or applicator.

A liquid film may also be made by creating an aerosol environment around the wafer through aspiration, atomization, sonification of a liquid stream or by applying a high voltage to a liquid stream, for example, as described in U.S. patent application Ser. No. 11/005,553, incorporated herein by reference. A transitional phase process can also be used. In a transitional phase process, gaseous or vaporous reactants are brought into contact with a solid phase material. The byproduct of the reaction between them is a condensed phase which is unstable and tends toward a vapor or gas state upon reaction initiation or partial or complete reaction of species. The vapor or gas state can create a liquid layer on the wafer. Combinations of these liquid film forming techniques may also be used.

For most uses, de-ionized water is used to form the liquid film. Various additives may be included in the liquid film. For example, alcohol or alcohol mixtures may be used to help control etch selectivity between various film types exposed to the etchant vapors. HCL may be used to enhance the removal of metal contaminants. Surfactants or other chemicals such as sulfuric acid or phosphoric acid may be used to modify the liquid film, and the interaction between the gas jet and liquid film. The liquid used to form the liquid film may be heated to 30, 40, or 50 up to 99° C.

III. Oxidizing Gas

Flow of the oxidizing gas may be achieved by various techniques. The oxidizing gas may be delivered as a jet or spray of gas to or across the wafer surface. The characteristics of the jet or spray of gas that can affect wafer polishing result include the number and type of orifices or nozzles through which the gas passes. The design of the nozzles or orifices including geometry, size, entry and exit profile, surface finish, etc. may also affect the polishing result. These nozzle design parameters can affect factors such as gas expansion, velocity, uniformity and area of impact (if any). These can in turn affect adiabatic cooling and condensate formation on the surface, or cause other changes. Other gas flow factors that may affect polishing include the distance between the wafer surface and the gas jet delivery point; gas flow rate; gas composition (whether ozone, oxygen, vapor or some other gas); and the angle of the gas flow relative to the wafer.

In general, the jet, spray or flow of gas is established so that it does not penetrate through, or entirely displace, the liquid layer. Rather, polishing can be better achieved when the gas jet thins the liquid at high points on the wafer surface. For this reason, ordinarily, flatter angles of impingement, ranging from about 0, 15, 20, 30 or to 45°, will often provide better results. For many applications, and especially in batch polishing, zero degrees (i.e., parallel to the wafer surface) works well. The oxidizing gas oxidizes the wafer surface primarily via bulk gas transport. Diffusion is less important.

The polishing effect depends on how the liquid film and the gas jet or flow interact. Wafer rotation can also modify the position, movement and geometry of the liquid film or droplets, and the relative speed between the gas and the liquid film on the wafer. In addition, the liquid film/gas jet interaction can be modified by using a pulsed or intermittent spray or jet of the liquid, or the gas jet(s), or both. The temperature of the wafer, liquid and/or the gas jet, may also be selected to affect polishing characteristics.

The speed of the gas used to achieve interaction with the liquid, for a polishing effect, will vary with specific system design. If the gas nozzle(s) or outlet(s) are close to the wafer, then slower gas speeds may be used. If the nozzles or outlets are further away, higher gas speeds will generally be used. For example, to polish a 300 mm diameter wafer, with gas nozzles adjacent to the wafer edges, and oriented to spray parallel to the place of the wafer, gas speeds of about 20 or 30 m/sec, up to about 150 or 250 m/sec are used. With these speeds, even the center of the wafer, which is over 150 mm from a nozzle, will be polished.

IV. Etchant

The etchant, such as HF, may be provided as a vapor or as a liquid. When the HF is delivered as a liquid applied to the wafer, pulsed spraying or atomization may be used. In vapor form, the etchant can be conveniently mixed and delivered with the oxidizing gas. Experiments have shown that a high degree of surface polish occurs when a high concentration of etchant or HF vapor is present in an oxidizing gas/etchant vapor stream delivered to the wafer surface. A high degree of surface polishing also occurs where the gas velocity is relatively high. Thus regions of a silicon wafer exposed for the greatest amount of time to the high velocity stream polish more than other areas on the wafer. A higher degree of polishing is observed in experiments where the HF liquid is maintained at a higher temperature in an HF vapor generator, for example from 30, 40, 50, 60, 70, 80, 90 or 95 up to 99 C., rather than at room temperature. This is apparently due to the result of the higher concentration of etchant vapor in the gas/vapor jet delivered to the wafer surface. In many instances, liquid drops are observed on the polished surfaces at the conclusion of the process. Some process conditions will result in surface polishing without visible liquid droplets being present.

HF vapor may alternatively be generated by running nitrogen through the vapor generator, as a carrier gas, and then mixing the nitrogen/HF vapor from the vapor generator with ozone. The mixed HF vapor/ozone gas can then be delivered into the process chamber.

V. Systems

Various systems may be used to perform the polishing process. FIGS. 1-4 show examples of such systems. However, the specific type of system used in not critical to the polishing process in every instance. Of course, various other systems, in addition to those shown in FIGS. 1-4 may also be used to perform polishing as described here. In the example of FIG. 1, a batch process system 10 has a rotor 14 within a chamber 12. The rotor 14 may hold a batch of wafers 20 directly, or the wafers may be in a cassette or carrier 16 held by the rotor 14. The rotor may spin about a vertical axis, or a horizontal axis, or about an axis between vertical and horizontal. A liquid source 46 supplies a liquid, such as DI water to liquid spray nozzles 22, optionally on one or more manifolds 24.

Ozone gas and a process vapor or gas, such as HF, (referred to here as a process vapor) are provided respectively from an ozone generator 30 (or other ozone source) and a process vapor generator 32. The process vapor may be generated in various ways. In the design shown in FIG. 1, the process vapor is generated via a gas source 38 supplying a carrier gas, such as nitrogen, to the process vapor generator 32, optionally through a gas manifold 40 and a mass flow controller 42. The mass flow controller 42, if used, is typically an electronic device that controls the mass of the carrier gas that flowing to the vapor generator 32.

Process liquid, such as HF liquid is provided from a fill vessel 34 to the process vapor generator, optionally via a pump 36. A heater/chiller 33, either integral with, or separate from the process vapor generator, maintains the liquid in the process vapor generator at a selected temperature. The process vapor outflow from the process vapor generator 32 is combined with the ozone from the ozone generator 30 at a manifold 44. The combined flow of process vapor and ozone is supplied to jet or spray nozzles or outlets 26 in the chamber 12. The ozone/HF gas/vapor mixture may also be generated using a vapor generator that bubbles the ozone through a bath of HF.

The gas source 38 supplies a vapor carrier gas such as nitrogen, air, oxygen, CO2, or another gas. Ozone gas may also be used as the carrier gas, and may be preferable in some applications, since it is integral to the oxidizing process, and minimizes the dilution effects of using an inert gas, such as nitrogen. When ozone is used as the carrier gas, the "carrier" gas is active, i.e., it chemically reacts inside the process chamber.

The system 10 can perform polishing as described above. A batch of wafers 20 is placed into the rotor 14. The rotor spins. Liquid is applied onto the wafer surfaces to be polished by liquid nozzles or outlets 22. A jet or spray of ozone/process vapor 25 is directed across the spinning wafers. The jet 25 maybe generally parallel to the plane of the wafer surface, or at an angle. The gas/vapor nozzles or outlets 26 are arranged to direct the jet or spray of ozone/process vapor 25 onto one side, or onto both sides of the wafer (for simultaneously polishing both sides). The action of the jet of spray 25 results in polishing, as described above. Gas from the source 38, such as nitrogen, may also be used to purge the chamber 16 of ozone and HF, after the polishing process is complete.

Figure 2:
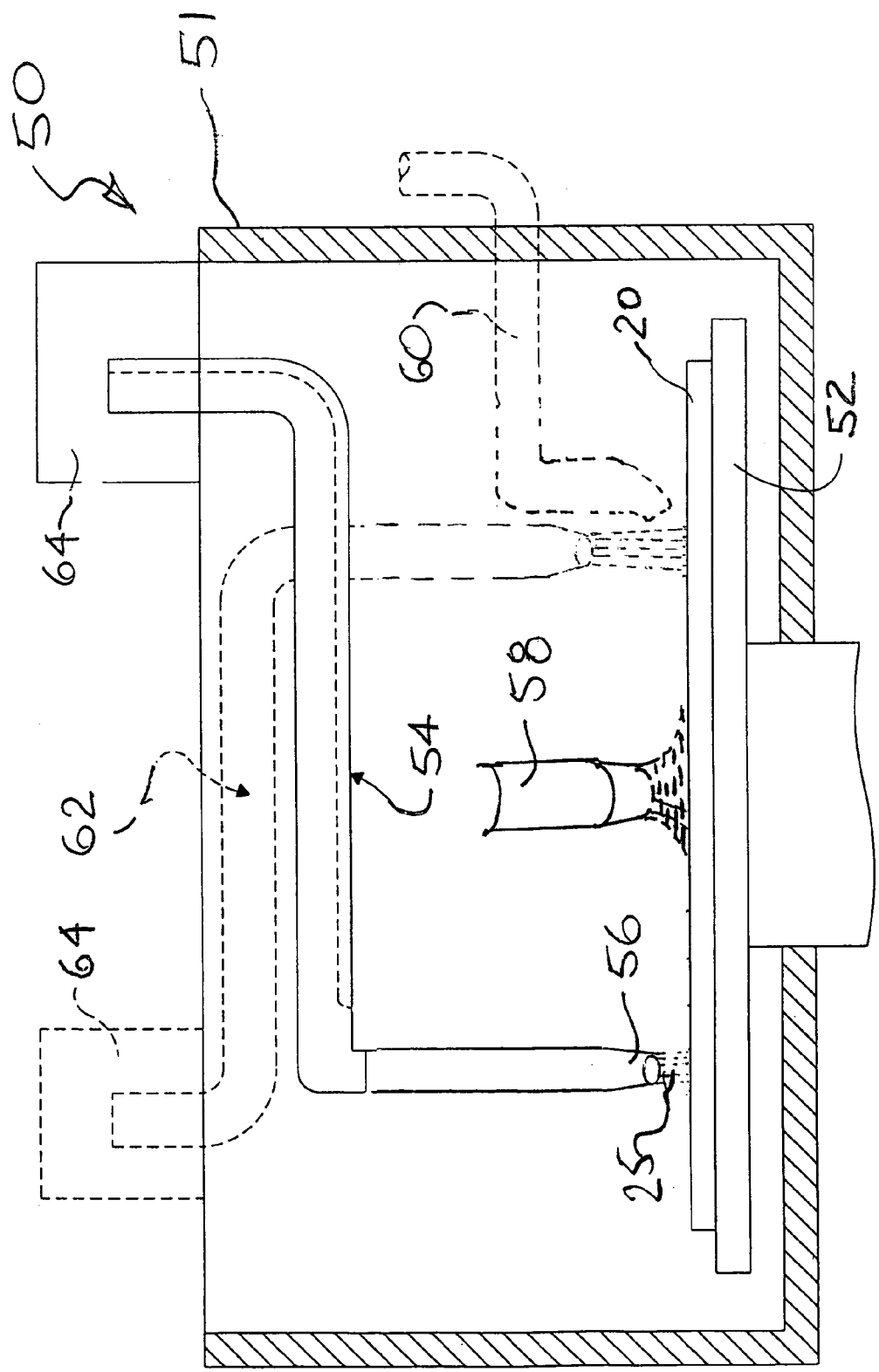
FIG. 2 is a section view of single wafer mode polishing system, having one or more reciprocating spray arms above the wafer surface.

FIG. 2 shows a system 50 for performing single wafer polishing. The wafer 20 is supported on a rotor or turntable 52. A liquid nozzle or applicator 58 applies liquid onto the wafer 20. A jet or spray 25 of process vapor and ozone is directed onto the wafer from a nozzle or outlet 56 on a reciprocating arm 54. A second reciprocating arm 62 may optionally be included to deliver liquid, instead or, or in addition to, the nozzle 58. Alternatively, the second reciprocating arm 62, if used, may also deliver a jet or spray 25 of process vapor and ozone. An arm driver 64 moves the arm 54 and/or 62 in a reciprocating or back and forth movement. A secondary liquid applicator 60, fixed or moving, may also be used. Arms, or other nozzle or outlet supports, may also be provided with translational or other forms of movement (in addition to reciprocating movement). The spacing between the nozzle 56 and the wafer may be adjusted as desired. In addition, the angle of the nozzle 56 may be set so that the jet 25 impinges on the wafer within a specific range of angles.

Figure 3:
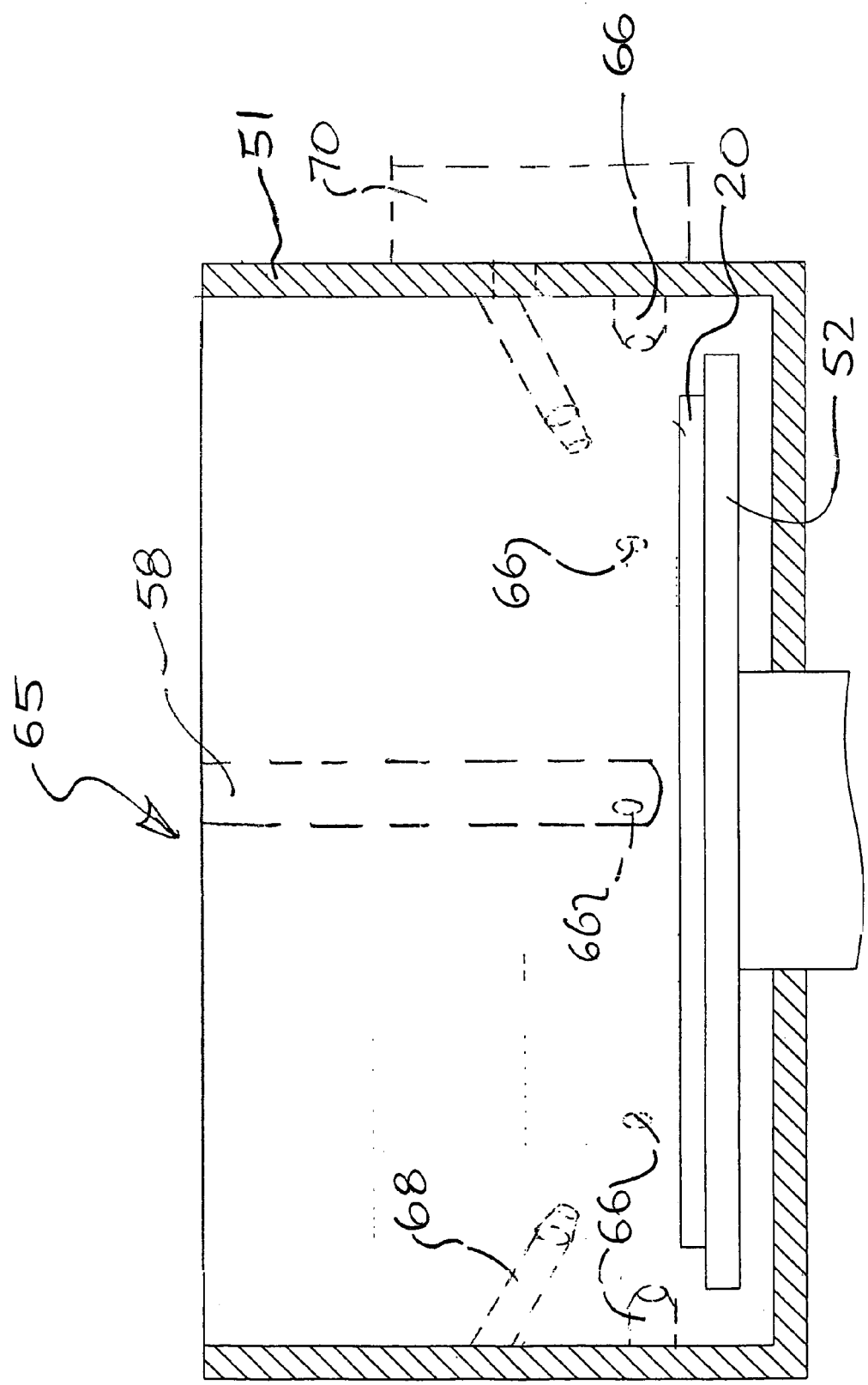
FIG. 3 is a section view of a single wafer mode polishing system having nozzles or outlets parallel to, or at an angle to, the wafer surface.

FIG. 3 shows another single wafer polishing system 65. The system 65 is similar to the system 50 shown in FIG. 2. However, jet nozzles 66 are supported from the chamber walls, and may be parallel to the wafer surface, as shown at nozzles 66, or set at an angle, as shown at nozzles 68. Combinations of parallel, normal, or angled nozzles or outlets may also be used to provide one or more of the jets 25 of process vapor and ozone. Optionally, the nozzles may be moved via nozzle positioners 70. This movement may be pivoting movement, to change the angle of the jet 25, or vertical movement, to change the spacing between the nozzle and the wafer, or telescoping movement, to change the position of the nozzle over the wafer.

Figure 4:
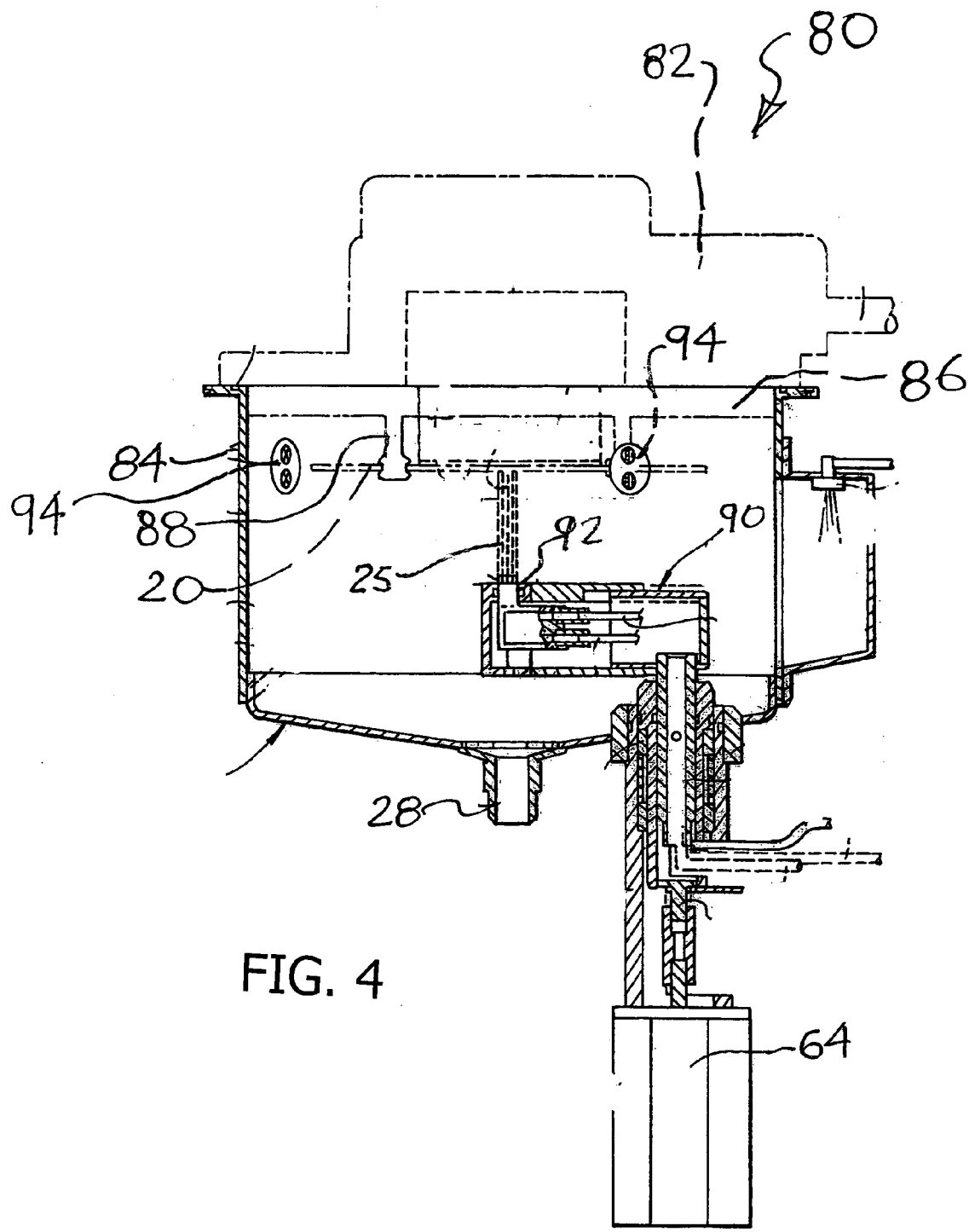
FIG. 4 is a section view of single wafer mode polishing system having a reciprocating spray arm below the wafer.

FIG. 4 shows another single wafer system 80 for polishing a wafer. The system 80 has a head 82 that engages with a base or bowl 84. A rotor 86 in the head has holders or fingers 88 that hold a wafer 20 at the edges. A motor in the head spins the rotor and the wafer. A jet nozzle 92 on an arm 90 in the base directs a jet 25 of process vapor and ozone against a down facing surface of the wafer 20. A liquid film is applied onto the wafer by liquid spray nozzles 94. Liquid is drained from the base via a drain opening 28.

As is apparent from the above description of FIGS. 1-4, many different systems may be used to perform the polishing process. The orientation of the wafer, the direction of the jet 25, the way the jet 25 is created, the way the liquid film is applied, and various other factors, can all vary with specific applications, while performing the polishing process described here. A diffuser plate or ring having a large number of holes, (e.g., 50-200) may be used in place of outlets or nozzles 66 and 84.

VI. Test Results

EXAMPLE 1

Ozone was delivered from an MKS 8403 ozone generator to an HF vapor generator as described in U.S. Pat. No. 6,162,734, incorporated herein by reference. The vapor generator contained liquid HF in an enclosed vessel. A spiral baffle was attached to the lid of the vapor generator, with the baffle extending down into the liquid but leaving a gas space between the surface of the liquid and the inner surface of the lid. Gas was introduced into this gas space, and forced to flow around the spiral baffle until it reached an exit at the end of the spiral. During this time, the gas was enriched with vapor from the liquid chemical source.

The ozone/HF mixture was then delivered to a single-wafer spray acid chamber, conceptually similar to FIG. 3, except that the ozone/HF mixture was delivered into the chamber through a diffuser mounted in the bottom of the chamber. The diffuser has a series of small holes or nozzles in close proximity to the wafer surface through which the vapor flows. The distance between the ozone/HF introduction point and the wafer surface was varied from about 1 mm to 3 cm.

We observed that the silicon surface directly in the path of the ozone/HF delivery (referred to here as the gas jet) tends to create a highly polished surface finish as compared to areas which are not more directly in the path of the jet.

EXAMPLE 2

In another experiment, water was sprayed onto a horizontally mounted 300 mm silicon wafer in a Teflon process chamber. We flowed nitrogen through the HF vapor generator at a rate of between 5 and 15 lpm. The 49% HF in the vapor generator was maintained at a temperature between 50 and 80 C. The vapor stream was mixed with ozone at about 20 lpm and a concentration of 200 g/Nm3. This combined stream was delivered through a series of six nozzles mounted in the side of the process chamber with three nozzles mounted slightly above and three nozzles slightly below the center line of the horizontal wafer. The flow from the nozzles was directed in a path substantially parallel to the wafer surface. Water at a temperature of 50-95 C. was periodically sprayed on the wafer surface to ensure the presence of a liquid film or droplets. The spray was delivered while the wafer was momentarily rotated at 200-600 rpm, to maintain the liquid film. The gas/vapor delivery was continuous. Spin speed was reduced between spray intervals. Etching primarily occurred at rotational speeds of 1-50 rpm in order to optimize etch uniformity. After 20 minutes the wafer was rinsed and dried. A lapped wafer surface appearance was achieved, with a surface finish approaching a mirror polish. A significant reduction in the lapping marks was also observed. Total silicon removal was in the range of 5-50 microns.

VII. Roughening

Various polishing tests conducted reveal that configuring the process and system so that the silicon is not exposed either to a liquid film or to direct jet of a gas, will result in a significant increase in surface roughness. This provides a surface roughening process. In the roughening process, the wafer surface is kept out of the gas/vapor path, so that the wafer is in a relatively still or static gas environment. Flow and temperature conditions of the gas/vapor stream are selected to minimize or eliminate the creation of a liquid film on the wafer surface.

This process roughens the wafer surface. This can be helpful in certain applications such as back-side metalization. A roughened surface promotes better adhesion between the surface and deposited metal films. It can also aide in establishing a good ohmic contact or simply be advantageous due to the increase in surface area, as is the case in the manufacture of solar cells. We have demonstrated that the surface is so rough and has such a greatly enhanced amount of surface per unit area, that even an oxide free silicon surface appears to be hydrophilic, where it would normally be hydrophobic. Thus an oxide free silicon surface may be rinsed and dried using conventional means without concern for water spots and the necessity of using surface tension gradient drying or an intermediate rinse/dry agent such as methanol or isopropyl alcohol.

While the term wafer as used here generally refers to silicon or semiconductor wafers, it also encompasses similar flat media articles, workpieces, or substrates which may not be silicon or a semiconductor, but which may be polished as described above. While the description above refers to ozone and HF for the purpose of polishing silicon wafers, other gas mixtures and etchants may similarly be used to accomplish polishing on other types of workpieces, wafers or substrates.

Various embodiments have been described to provide specific details for a thorough understanding and enabling description of these embodiments. A person skilled in the art, however, will understand that the invention may be practiced without several of these details or additional details can be added to the invention. Well-known structures and functions have not been shown or described in detail to avoid unnecessarily obscuring the description of the embodiments. Where the context permits, singular or plural terms may also include the plural or singular term, respectively. Moreover, unless the word "or" is expressly limited to mean only a single item exclusive from the other items in reference to a list of two or more items, then the use of "or" in such a list is to be interpreted as including (a) any single item in the list, (b) all of the items in the list, or (c) any combination of items in the list. U.S. Pat. No. 6,869,487 is incornorated herein by reference.

While embodiments and applications of the present methods and systems have been shown and described, it will be apparent to one skilled in the art that modifications and substitutions are possible without departing from the I spirit and scope of invention. The invention, therefore, should not be limited, except by the following claims and their equivalents.

The invention claimed is:

1. A method for smoothing a surface of a wafer, comprising:
   forming a liquid layer on a surface of the wafer, with the liquid layer including an acid;

directing a flow of an oxidizing gas across the liquid layer, with the flow of oxidizing gas thinning the liquid layer at high points on the surface of the wafer more than at low points on the wafer surface; and with the flow of oxidizing gas oxidizing and removing at least one micron of wafer material from the high points on the wafer surface, to smooth the wafer surface.

2. The method of claim 1 with the acid provided as a vapor with the oxidizing gas.

3. The method of claim 2 wherein the acid comprises a liquid sprayed onto the wafer.

4. The method of claim 1 wherein the oxidizing gas comprises ozone.

5. The method of claim 1 wherein the flow is directed at an angle relative to the surface of the wafer ranging from about 0 to 45°.

6. The method of claim 1 further comprising spinning the wafer.

7. The method of claim 1 wherein the liquid layer further comprises a surfactant.

8. A method for polishing a surface of a silicon wafer, comprising:

forming a layer of heated liquid on a surface of the workpiece, with the liquid comprising water and a silicon etchant;

spinning the workpiece;

directing a spray of ozone gas at the liquid layer from at least one nozzle adjacent to the wafer, with the spray of ozone gas thinning the liquid layer at high points on the workpiece surface more than at low points of the workpiece surface, and with the ozone gas chemically reacting with the surface of the wafer at the high points to remove at least one micron of silicon, resulting in polishing of the surface of the wafer.

9. The method of claim 8 further comprising spinning the wafer at 1-50 rpm.

10. The method of claim 8 with the spray of ozone gas directed at an angle relative to the liquid layer ranging from 0-45 degrees.

11. The method of claim 8 wherein the liquid is heated to a temperature ranging from about 30-99° C.

12. The method of claim 8 wherein the spray of ozone gas is directed substantially parallel to the surface of the liquid layer.

13. The method of claim 8 wherein the liquid film is microscopic and not visible.

14. The method of claim 8 wherein the liquid film is created by condensation of a vapor onto the wafer.

15. A method for polishing a surface of a silicon wafer, comprising:

forming a layer of heated liquid on a surface of the workpiece, with the liquid comprising water and an acid;

directing a jet of ozone gas at a target area on the surface of the wafer, with the jet of ozone gas having an initial velocity of more than about 20 meters/second, and with the jet of ozone gas thinning the liquid layer on the target area, and with the liquid layer at high points of the wafer surface in the target area thinned more than the liquid layer at low points in the target area;

removing at least five microns of silicon material from high points in the target area via chemical reaction between the silicon material at the high points and the spray of ozone gas, to polish the surface of the wafer.

16. The method of claim 8 further comprising spinning the wafer at 1-50 rpm.

* * * * *